(12) United States Patent
Akkerman et al.

(10) Patent No.: US 8,450,723 B2
(45) Date of Patent: May 28, 2013

(54) APPARATUS HAVING AN AROMATIC DIELECTRIC AND AN AROMATIC ORGANIC SEMICONDUCTOR INCLUDING AN ALKYL CHAIN

(75) Inventors: Hylke Akkerman, Groningen (NL); Howard Edan Katz, Summit, NJ (US)

(73) Assignee: Alcatel Lucent, Paris (FR)

( * ) Notice: Subject to any disclaimer, the term of this patent is extended or adjusted under 35 U.S.C. 154(b) by 1855 days.

(21) Appl. No.: 10/701,183

(22) Filed: Nov. 4, 2003

(65) Prior Publication Data
US 2005/0093031 A1   May 5, 2005

(51) Int. Cl.
*H01L 35/24*   (2006.01)

(52) U.S. Cl.
USPC ........................ 257/40; 257/288; 257/E51.288

(58) Field of Classification Search
USPC .......................................................... 257/288
See application file for complete search history.

(56) References Cited

U.S. PATENT DOCUMENTS

| | | | |
|---|---|---|---|
| 5,192,580 A | 3/1993 | Blanchet-Fincher | |
| 5,288,528 A | 2/1994 | Blanchet-Fincher | |
| 5,347,144 A | 9/1994 | Garnier et al. | |
| 5,523,192 A | 6/1996 | Blanchet-Fincher | |
| 5,563,019 A | 10/1996 | Blanchet-Fincher | |
| 5,625,199 A | 4/1997 | Baumbach et al. | |
| 5,766,819 A | 6/1998 | Blanchet-Fincher | |
| 5,840,463 A | 11/1998 | Blanchet-Fincher | |
| 5,981,970 A | 11/1999 | Dimitrakopoulos et al. | |
| 6,051,318 A | 4/2000 | Kwon | |
| 6,143,451 A | 11/2000 | Blanchet-Fincher | |
| 6,146,792 A | 11/2000 | Blanchet-Fincher et al. | |
| 6,174,651 B1 | 1/2001 | Thakur | |
| 6,265,243 B1 | 7/2001 | Katz et al. | |
| 6,352,811 B1 | 3/2002 | Patel et al. | |
| 6,352,812 B1 | 3/2002 | Shimazu et al. | |
| 6,403,397 B1* | 6/2002 | Katz ................................ 438/99 |
| 6,551,717 B2 | 4/2003 | Li et al. | |
| 6,863,936 B2* | 3/2005 | Chen et al. ..................... 427/554 |
| 7,053,401 B2 | 5/2006 | Ardakani et al. | |
| 7,102,154 B2 | 9/2006 | Hanna et al. | |
| 7,132,682 B2 | 11/2006 | Ong et al. | |
| 2002/0149315 A1 | 10/2002 | Blanchet-Fincher | |
| 2003/0173599 A1* | 9/2003 | Nakai ............................ 257/225 |
| 2003/0175551 A1 | 9/2003 | Smith et al. ................... 428/690 |

FOREIGN PATENT DOCUMENTS

| | | |
|---|---|---|
| JP | H04-133351 A | 5/1992 |
| JP | H08-191162 A | 7/1996 |
| JP | 2001-244467 A | 9/2001 |
| JP | 2002-324931 A | 11/2002 |

(Continued)

OTHER PUBLICATIONS

Smith et al., U.S. Patent Application Publication No. 2003/0175551A1, entitled "Surface Modified Organic Thin Film Transistors", published on Sep. 18, 2003.

(Continued)

*Primary Examiner* — Thanh Nguyen
(74) *Attorney, Agent, or Firm* — Jay Brown Law Firm

(57) ABSTRACT

Semiconductor apparatus comprising: a dielectric layer comprising a surface, a portion of the surface having exposed aromatic groups; and a polycrystalline semiconductor layer comprising an organic semiconductor composition overlying and in contact with the portion of the surface, the organic semiconductor composition comprising a compound comprising a chain-like moiety, the chain-like moiety comprising a conjugated thiophene or phenyl group and comprising alkyl chains at ends of the chain-like moiety. Devices comprising semiconductor apparatus, methods for making semiconductor apparatus, and methods for making devices.

20 Claims, 6 Drawing Sheets

FOREIGN PATENT DOCUMENTS

| | | |
|---|---|---|
| JP | 2003-236453 A | 8/2003 |
| WO | WO 01/87634 A2 | 11/2001 |
| WO | WO 02/08801 A1 | 1/2002 |
| WO | WO 02/092352 A1 | 11/2002 |
| WO | 03/041185 A2 | 5/2003 |
| WO | 03/052841 A1 | 6/2003 |
| WO | 03/067667 A1 | 8/2003 |

OTHER PUBLICATIONS

Qin, Dong et al., "Fabrication of Ordered Two-Dimensional Arrays of Micro- and Nanoparticles Using Patterned Self-Assembled Monolayers as Templates", Adv. Mater., vol. 11, No. 17, pp. 1433-1437 (1999).
Afzali et al. High-Performance, Solution-Processed Organic Thin Film Transistors from a Novel Pentacene Precursor, J. Am. Chem. Soc., 2002, pp. 8812-8813, vol. 124.
Afzali et al., Synthesis and Application of Pentacene Precursor in OTFT, Publisher: IBM Research Division, Published in: Yorktown Heights, NY.
Aizenberg et al., Control of Crystal Nucleation by Patterned Self-Assembled Monolayers, Nature, Apr. 8, 1999, pp. 495-498, vol. 398.
Aizenberg et al., Oriented Growth of Calcite Controlled by Self-Assembled Monolayers of Functionalized Alkanethiols Supported on Gold and Silver, J. Am. Chem. Soc., 1999, pp. 4500-4509, vol. 121.
Akimichi et al., Field-Effect Transistors Using Alkyl Substituted Oligothlophenes, Appl. Phys. Lett., 1991, pp. 1500-1502, vol. 58, No. 14.
Butko et al., Limit of Field Effect Mobility on Pentacene Single Crystal, Publisher: Los Alamos National Laboratory, Published in: Los Alamos, New Mexico.
Cai et al., Self Assembly in Ultrahigh Vacuum: Growth of Organic Thin Films with a Stable In-Plane Directional Order, J. Am. Chem. Soc., 1998, pp. 8563-8564, vol. 120.
Collet et al., High Anisotropic Conductivity in Organic Insulator/Semiconductor Monolayer Heterostructure, Applied Physics Letters, Mar. 6, 2000, pp. 1339-1341, vol. 76, No. 10, Publisher: American Institute of Physics.
Collet et al., Low-Voltage, 30 nm Channel Length, Organic Transistors with a Self-Assembled Monolayer as Gate Insulating Films, Applied Physics Letters, Apr. 3, 2000, pp. 1941-1943, vol. 76, No. 14.
Collet et al., Nano-field Effect Transistor with an Organic Self-Assembled Monolayer as Gate Insulator, Applied Physics Letters, Nov. 2, 1998, pp. 2681-2683, vol. 73, No. 18.
De Boer et al., Synthesis and Characterization of Conjugated Mono- and Dithiol Oligomers and Characterization of Their Self-Assembled Monolayers, Langmuir, 2003, pp. 4272-4284, vol. 19.
Echavarren et al., J. Am. Chem. Soc., 1987, pp. 5478-5486, vol. 109.
Steudel et al., Patterned growth of pentacene, Applied Physics Letters, vol. 85, No. 23, pp. 5550-5552 (Dec. 6, 2004).
Qin et al., "Fabrication of Ordered Two-Dimensional Arrays of Micro- and Nanoparticles Using Patterned Self-Assembled Monolayers as Templates", Adv. Mater., vol. 11, No. 17, pp. 1433-1437 (1999).
U.S. Appl. No. 10/256,885, filed Sep. 27, 2002, Bao et al.
U.S. Appl. No. 10/669,780, filed Sep. 24, 2003, Bao.
U.S. Appl. No. 60/505,533, filed Sep. 24, 2003, Meth.
U.S. Appl. No. 60/505,880, filed Sep. 24, 2003, Meth et al.
U.S. Appl. No. 10/671,303, filed Sep. 24, 2003, Bao et al.
U.S. Appl. No. 10/722,613, filed Nov. 26, 2003, Aizenberg et al.
Forrest, Ultrathin Organic Films Grown by Organic Molecular Beam Deposition and Related Techniques, Chem. Rev., pp. 1793-1896, vol. 97, Publisher: American Chemical Society, 1997.
Halik et al., High-Mobility Organic Thin-Film Transistors Based on a, a'-didecyloligothiophenes, Journal of Applied Physics, Mar. 1, 2003, pp. 2977-2981, vol. 93, No. 5.
Han et al., Effect of Magnesium Ions on Oriented Growth of Calcite on Carboxylic Acid Functionalized Self-Assembled Monolayer, J. Am. Chem. Soc., 2003, pp. 4032-4033, vol. 125.
Han et al., Face-Selective Nucleation of Calcite on Self-Assembled Monolayers of Alkanethiols: Effect of the Parity of the Alkyl Chain, Angew. Chem. Int. Ed., 2003, pp. 3668-3670, vol. 42.
Hong et al., Thiophene-Phenylene and Thiophene-Thiazole Oligomeric Semiconductors with High Field-Effect Transistor On/Off Ratios, Chem. Mater., 2001, pp. 4686-4691, vol. 13, No. 12.
Johnston et al., Low-Energy Vibrational Modes in Phenylene Oligomers Studied by THz Time-Domain Spectroscopy, Chemical Physics Letters, 2003, pp. 256-262, vol. 377.
Katz et al., Synthesis, Solubility, and Field-Effect Mobility of Elongated and Oxa-substituted a,w-Dialkyl Thiophene Oligomers: Extension of 'Polar Intermediate' Synthetic Strategy and Solution Deposition on Transistor Substrates, Chem. Mater., 1998, pp. 633-638, vol. 10, No. 2.
Klauk et al., High-Mobility Polymer Gate Dielectric Pentacene Thin Film Transistors, Journal of Applied Physics, Nov. 1, 2002, pp. 5259-5263, vol. 92, No. 9.
Klauk et al., Pentacene Organic Thin-Film Transistors and ICs, Solid State Technology, Mar. 2000, pp. 63-76, vol. 43, No. 3.
Li et al., Field-Effect Transistors Based on Thiophene Hexamer Analogues with Diminished Electron Donor Strength, Chem. Mater., 1999, pp. 458-465, vol. 11, No. 2.
Matters et al., Organic Field-Effect Transistors and All-Polymer Integrated Circuits, Optical Materials, 1999, pp. 189-197, vol. 12.
Meyer Zu Heringdorf et al., Growth Dynamics of Pentacene Thin Films, Nature, Aug. 2, 2001, pp. 517-520, vol. 412.
Mushrush et al., Easily Processable Phenylene-Thiophene-Based Organic Field-Effect Transistors and Solution-Fabricated Nonvolatile Transistor Memory Elements, J. Am. Chem. Soc., 2003, pp. 9414-9423, vol. 125, No. 31.
Seo et al., Interpretation of the Mass Change Behavior in the Binary Monolayer of Hydroquinone-tethered Alkylthiol and Aminoalkythiol, Bull. Korean Chem. Soc., 2002, pp. 1671-1673, vol. 23, No. 11.
Stabel et al., Scanning Tunneling Microscopy of Alkylated Oligothiophenes at Interfaces with Graphite, Synthetic Metals, 1994, pp. 47-53, vol. 67.
Tanimoto et al., Binary Phase Chlorination of Aromatic Hydrocarbons with Solid Copper(II) Chloride: Reaction Mechanism, Bull. Chem. Soc. Japan, 1979, pp. 3586-3591, vol. 52, No. 12.
Xia et al., Soft Lithography, Angew. Chem. Int. Ed., 1998, pp. 550-575, vol. 37.
Ali Afzali et al., "Synthesis and Application of Pentacene Precursor in OTFT," IBM Research Division, Yorktown Heights, New York, presented at Printed Electronics Conference held Dec. 7-8, 2004, New Orleans, Louisiana, abstract downloaded from http://www.idtechex.com/events/presentations/developments-at-ibm-on-solution-processable-organic-semiconductors-000145.asp.
Butko et al., "Limit of Field Effect Mobility on Pentacene Single Crystal," Applied Physics Letters, vol. 83, No. 23, pp. 4773-4775, pre-publication version submitted on May 16, 2003, abstract downloaded from http://arxiv.org/ftp/cond-mat/papers/0305/0305402.pdf).
Butko et al., "Field-effect transistor on pentacene single crystal," Applied Physics Letters, vol. 83, No. 23, pp. 4773-4775 (Dec. 8, 2003).
Dimitrakopoulos et al., "Field-effect transistors comprising molecular beam deposited alpha-, omega-di-hexyl-hexathienylene and polymeric insulator," Synthetic Metals, vol. 92 (1998), pp. 47-52.

* cited by examiner

APPARATUS HAVING AN AROMATIC DIELECTRIC AND AN AROMATIC ORGANIC SEMICONDUCTOR INCLUDING AN ALKYL CHAIN

The U.S. Government has a paid-up license in this invention and the right in limited circumstances to require the patent owner to license others on reasonable terms as provided for by the terms of Advanced Technology Program Cooperative Agreement No. 70NANB2H3032 awarded by the National Institute of Standards and Technology.

FIELD OF THE INVENTION

The present invention relates to devices comprising organic semiconductor crystals, circuits containing devices comprising such crystals, and methods for making the same.

BACKGROUND OF THE INVENTION

Organic thin film transistors (TFTs) are expected to become key components of plastic circuitry. TFTs have applicability as well to other systems such as silicon circuitry. One of the most significant challenges in bringing TFTs into commercial use is to facilitate the effective deposition of organic semiconductors on a substrate, preferably in a manner that is inexpensive as compared to silicon based technology. In order to exhibit suitable electrical properties, organic semiconductors preferably are deposited as thin and uniform films comprising relatively large single crystals within ordered polycrystalline domains, which is a difficult task. See, for example, C. Cai et al., "Self Assembly in Ultrahigh Vacuum: Growth of Organic Thin Film with a Stable In-Plane Directional Order," J. Am. Chem. Soc., Vol. 120, p. 8563 (1998).

Much effort has been made to develop simple fabrication techniques for attaining the necessary uniformity and order in an organic semiconductor film. For example, several groups have experimented with solution casting of thiophene oligomer films, in which a solution of an organic semiconductor is essentially dropped onto a substrate and the solvent is evaporated by heating. However, these casting processes have generally provided relatively poor uniformity and coverage by such oligomeric thiophene solutes. More importantly, crystal sizes have typically been small and the resultant mobilities, even over small areas, have often been unacceptably low or non-uniform compared to films formed by vapor phase techniques. See, for example, A. Stabel and J. P. Rabe, "Scanning tunneling microscopy of alkylated oligothiophenes at interfaces with graphite," Synthetic Metals, Vol. 67, p. 47 (1994); H. E. Katz et al., "Synthesis, Solubility, and Field-Effect Mobility of Elongated and Oxa-substituted $\alpha,\omega$-Dialkyl Thiophene Oligomers. Extension of 'Polar Intermediate' Synthetic Strategy and Solution Deposition on Transistor Substrates," Chemistry of Materials, Vol. 10, No. 2, p. 633 (1998); H. Akimichi et al., "Field-effect transistors using alkyl substituted oligothiophenes," Appl. Phys. Lett., Vol. 58, No. 14, p. 1500 (1991); M. Mushrush et al., "Easily Processable Phenylene-Thiophene-Based Organic Field-Effect Transistors and Solution-Fabricated Nonvolatile Transistor Memory Elements," J. Am. Chem. Soc., Vol. 125, pp. 9414-9423 (2003); and Hong, X. M. et al., "Thiophene-Phenylene and Thiophene-Thiazole Oligomeric Semiconductors with High Field-Effect Transistor On/Off Ratios," Chem. Mater., 13, pp. 4686-4691 (2001).

One process for forming devices utilizing organic semiconductor films, disclosed in Katz U.S. Pat. No. 6,403,397 issued on Jun. 11, 2002 and entitled "Process For Fabricating Organic Semiconductor Device Involving Selective Patterning," involved treating a surface to selectively provide regions of greater affinity and lesser affinity for an organic semiconductor or an organic semiconductor solution. When the organic semiconductor, or solution comprising the semiconductor, was deposited on the treated surface, either the organic semiconductor or the organic semiconductor solution dewetted from the lesser affinity regions or the resultant film adhered only weakly to the lesser affinity regions such that selective removal was readily performed. Even where such removal was not performed, the portions of the organic semiconductor film overlying the greater affinity regions exhibited higher conductivity and better film continuity relative to the other portions of the film. Further processes for forming devices utilizing organic semiconductor films are disclosed in Katz et al., U.S. Pat. Nos. 6,265,243 and 6,551,717, respectively issued on Jul. 24, 2001 and Apr. 22, 2003, both entitled, "Process for Fabricating Organic Circuits."

There remains a need for semiconductor devices comprising organic semiconductors in the form of larger and better ordered polycrystalline semiconductor domains having accordingly high channel mobility. There further is a need for methods of making such semiconductor devices.

SUMMARY OF THE INVENTION

The present invention provides an apparatus comprising an organic semiconductor composition, comprising a chain-like compound comprising a conjugated thiophene or phenyl group and comprising alkyl chains at extremities of the chain-like compound. The semiconductor composition is in contact with an aromatic dielectric layer that promotes crystal growth in the semiconductor composition. The present invention further provides methods of making such semiconductor apparatus. In exemplary embodiments, the semiconductor compound is dissolved into solution by a suitable liquid solvent and is crystallized on a dielectric layer from the solution phase in the presence of a vapor of the solvent.

In one embodiment, a semiconductor apparatus is provided, comprising: a dielectric layer comprising a surface, a portion of said surface having exposed aromatic groups; and a polycrystalline semiconductor layer comprising an organic semiconductor composition overlying and in contact with said portion of said surface, said organic semiconductor composition comprising a compound comprising a chain-like moiety, the chain-like moiety comprising a conjugated thiophene or phenyl group and comprising alkyl chains at ends of the chain-like moiety. In another embodiment, such a semiconductor apparatus is provided, further comprising a gate electrode; a source electrode; and a drain electrode; said source and drain electrodes being in contact with a channel portion of said semiconductor layer, said gate electrode being positioned to control a conductivity of said channel portion.

In another embodiment, a method of making such a semiconductor apparatus is provided, comprising the steps of: providing a dielectric layer comprising a surface, a portion of said surface having exposed aromatic groups; and providing a polycrystalline semiconductor layer comprising an organic semiconductor composition overlying and in contact with said portion of said surface, said organic semiconductor composition comprising a compound comprising a chain-like moiety, the chain-like moiety comprising a conjugated thiophene or phenyl group and comprising alkyl chains at ends of the chain-like moiety. In a further embodiment, the step of providing the polycrystalline semiconductor layer comprises the steps of: providing a solution of said organic semiconductor composition in a solvent; providing an atmosphere comprising vapor of a solvent for said organic semiconductor composition; applying said solution to said portion of said dielectric layer in the presence of said atmosphere; and evaporating said solvent from said applied solution.

In further embodiments, integrated circuits comprising such semiconductor apparatus, and methods for making such integrated circuits are provided.

A more complete understanding of the present invention, as well as further features and advantages of the invention, will be apparent from the following detailed description and the accompanying drawings.

The drawings of this specification are not to scale but are merely schematic representations, and thus are not intended to portray the specific dimensions of the various embodiments.

DETAILED DESCRIPTION OF THE INVENTION

Embodiments will now be described more fully with reference to the accompanying drawings and description. This invention may, however, be embodied in various forms and should not be construed as being limited to the embodiments set forth herein.

The present invention provides an apparatus comprising an organic semiconductor composition, comprising a chain-like compound comprising a conjugated thiophene or phenyl group and comprising alkyl chains at extremities of the chain-like compound. The semiconductor composition is in contact with an aromatic dielectric layer that promotes crystal growth in the semiconductor composition. The present invention also provides methods for making such semiconductor apparatus. In exemplary embodiments, the semiconductor composition is dissolved into solution by a suitable liquid solvent and is crystallized on a dielectric layer from the solution phase in the presence of a vapor of the solvent.

Figure 1:
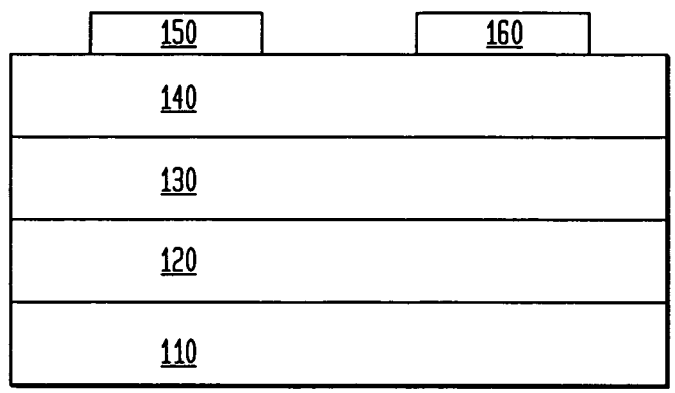
FIG. 1 shows an exemplary embodiment of a thin film transistor.

FIG. 1 shows an exemplary embodiment of a thin film transistor 100. Thin film transistor 100 comprises a supporting substrate 110, a gate electrode 120, a dielectric layer 130, a semiconductor layer 140, a source electrode 150, and a drain electrode 160. The gate electrode 120 is a substantially planar material, one side of which is supported by and adjacent to the substantially planar supporting substrate 110. The dielectric layer 130 is a substantially planar material, one side of which is supported by and adjacent to the other side of the gate electrode 120. The semiconductor layer 140 is a substantially planar material formed from a semiconductor composition, one side of which is supported by and adjacent to the other side of the dielectric layer 130. The source electrode 150 and the drain electrode 160 are supported by and adjacent to the other side of the semiconductor layer 140 in a spaced apart relationship. In operation of the exemplary thin film transistor 100, a voltage applied to the gate electrode 120 can be used to control a flow of charge carriers between the source electrode 150 and the drain electrode 160. Charge carriers are transported between the source electrode 150 and the drain electrode 160 through a portion of the semiconductor layer 140. The gate electrode 120, source electrode 150, and drain electrode 160 may be connected into an external circuit, not shown, such as an integrated circuit for example.

Figure 2:
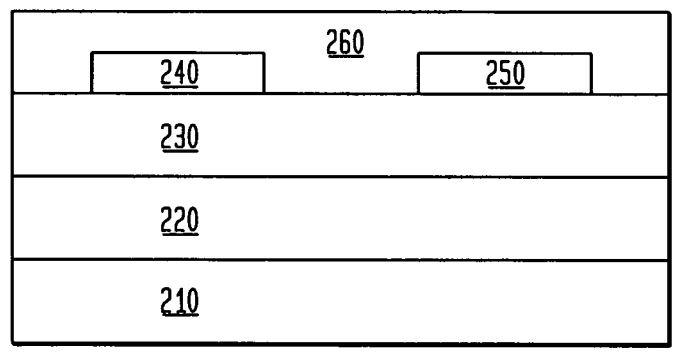
FIG. 2 shows a further exemplary embodiment of a thin film transistor.

FIG. 2 shows another exemplary embodiment of a thin film transistor 200. Thin film transistor 200 comprises a supporting substrate 210, a gate electrode 220, a dielectric layer 230, a source electrode 240, a drain electrode 250, and a semiconductor layer 260. The gate electrode 220 is a substantially planar material, one side of which is supported by and adjacent to the substantially planar supporting substrate 210. The dielectric layer 230 is a substantially planar material, one side of which is supported by and adjacent to the other side of the gate electrode 220. The semiconductor layer 260 is a substantially planar material formed from a semiconductor composition, one side of which is supported by and adjacent to the other side of the dielectric layer 230. The source electrode 240 and the drain electrode 250 are supported in a spaced apart relationship by the dielectric layer 230 and interposed between the dielectric layer 230 and a non-channel portion of the semiconductor layer 260. In operation of the exemplary thin film transistor 200, a voltage applied to the gate electrode 220 can be used to control a flow of charge carriers between the source electrode 240 and the drain electrode 250. Charge carriers are transported between the source electrode 240 and the drain electrode 250 through a channel portion of the semiconductor layer 260. The gate electrode 220, source electrode 240, and drain electrode 250 may be connected into an external circuit, not shown, such as an integrated circuit for example.

The semiconductor composition comprises a semiconductor compound comprising a chain-like moiety comprising a conjugated thiophene or phenyl group and comprising alkyl chains at chain-like compound extremities. The conjugated thiophene and phenyl groups may be fused and/or bridged. The thiophene and phenyl groups may be unsubstituted or comprise alkyl or hetero substituents. The semiconductor compound may be a monomer, or may form part of an oligomer or polymer. In the case of such an oligomer or polymer, the conjugation desirably is adequately interrupted so that the semiconductor compound is soluble in an appropriate solvent. In one embodiment, such a semiconductor compound is provided that comprises between about 3 and about 10 conjugated aromatic rings. Each fused ring, if any, in such a conjugated structure counts as one such ring. Semiconductor compound molecules having less than three conjugated aromatic rings on average may result in inadequate charge carrier mobility. In another embodiment, such semiconductor compound molecules comprise between about 3 and about 6 conjugated aromatic rings. In a further embodiment, such semiconductor compound molecules comprise at least 2 thiophene rings conjugated with other aromatic rings. In another embodiment, such semiconductor compound molecules comprise 5 or less conjugated thiophene rings to avoid sudden precipitation of the semiconductor out of solution. In an additional embodiment, the alkyl chains may comprise between about 3 and about 12 carbon atoms. In another embodiment, the alkyl chains may comprise between about 6 and about 8 carbon atoms. The alkyl chains may increase the lattice ordering of semiconductor compound molecules during formation of the semiconductor layer. Desirably, the alkyl chains are saturated, although they can comprise unsaturation. The alkyl groups may be unbranched or comprise minor branching, such as methyl or ethyl branching for example. The alkyl groups can comprise oxygen, nitrogen and/or sulfur linkages in the alkyl chain. The alkyl groups can further comprise hetero substituents such as halogens for example.

One suitable compound within the foregoing class of semiconductor compounds is, for example, 5,5'-Bis(4-n-hexylphenyl)-2,2'-bithiophene. This compound can be referred to as 6PTTP6, where 6 delineates a 1-hexyl group, P delineates a 1,4-phenylene linkage, and T delineates a 2,5-thienylene linkage. Another suitable compound within the foregoing class of semiconductor compounds is, for example, 5,5''-Bis(4-n-hexylphenyl)-2,2':5',2''-terthiophene (6PTTTP6). An additional suitable compound within the foregoing class of semiconductor compounds is, for example, 5,5'''-Bis(4-n-hexylphenyl)-2,2':5',2'':5'',2'''-quaterthiophene (6PTTTTP6). A further suitable compound within the foregoing class of semiconductor compounds is, for example, 1,4-Bis[5-(4-n-hexylphenyl)-2-thienyl]benzene (6PTPTP6). Another suitable compound within the foregoing class of semiconductor compounds is, for example, 2,5-Bis[4(4'-n-hexylphenyl)phenyl]thiophene (6PPTPP6). An additional suitable compound within the foregoing class of semiconductor compounds is, for example, 5,5'''-Bis(4-n-hexyl)-2,2':5',2'':5'',2'''-quaterthiophene (6TTTT6). A further suitable compound within the foregoing class of semiconductor compounds is, for example, 5,5''''-Bis(4-n-hexyl)-2,2':5',2'':5'',2''':5''',2''''-pentathiophene (6TTTTT6). Another suitable compound within the foregoing class of semiconductor compounds is, for example, 1,4-Bis[(5-n-hexyl)-2,2'-bithienyl]benzene (6TTPTT6). An additional suitable compound within the foregoing class of semiconductor compounds is, for example, 2,6-bis(5-hexylthien-2-yl)naphthalene. This compound can be delineated as 6TNT6, in which N delineates a naphthalene-2,6-diyl moiety.

The dielectric layers 130 and 230 are formed from an organic composition that comprises aromatic groups in order to provide compatibility with the semiconductor layers 140 and 260. Suitable aromatic groups to be included in compounds used for making such organic compositions include, for example, naphthalenes, benzenes, and phenols. The dielectric layers 130 and 230 may comprise, for example, a polyphenol, a polystyrene, a poly(4-vinylphenol-co-2-hydroxyethyl methacrylate), or a poly(phenoxyethyl methacrylate). A poly(4-vinylphenol-co-2-hydroxyethyl methacrylate) polymer is commercially available from Sigma-Aldrich, St. Louis, Mo. U.S.A., catalog No. 47,458-4. In one embodiment, the dielectric layer has at least the polarizability of chlorobenzene in order to promote the wetting of the dielectric layer by the semiconductor in solution during semiconductor layer formation, discussed below. Polarizability of a material is proportional to its refractive index. The refractive index of chlorobenzene is about 1.52. Hence, aromatic compounds having a refractive index of at least about 1.52 desirably can be used. The refractive indices of m-cresol and methylnaphthalene, for example, are 1.54 and 1.61, respectively. Desirably, the surface tension of the dielectric layer is at least about equivalent to the surface tension of a polystyrene film, to promote wetting of the semiconductor solution and adhesion of the semiconductor layer. Further, desirably the dielectric layer is free of dopants that could lead, for example, to poor on/off ratios in fabricated devices.

The supporting substrates 110 and 210 can be made from suitable dielectric materials such as silicon wafers having a silicon dioxide coating. The silicon wafer provides structural support for the transistors 100 and 200. In alternative embodiments, a suitable supporting substrate composed of other materials such as Mylar® polyester is used, or the supporting substrate is omitted and the corresponding gate electrodes 120 and 220 are made self supporting and otherwise electrically isolated for operation of the transistors 100 and 200.

The gate electrodes 120 and 220, the source electrodes 150 and 240, and the drain electrodes 160 and 250 can be fabricated, for example, from a conductive material such as a metal, a heavily doped semiconductor, a conductive ceramic, or a conductive polymer. Suitable metals include, for example, aluminum, gold, silver, gallium, indium, platinum, nickel, titanium, copper, and alloys. Any metal that can, for example, be electroplated, evaporated, cast, electrolessly deposited or sputtered, can be used. Conductive ceramics include indium tin oxide, for example. Conductive polymers include, for example, polyaniline and poly(ethylene dioxythiophene), the latter also known as "PEDOT".

FIGS. 1 and 2 as discussed above relate to exemplary and non limiting embodiments. For example, the embodiments shown in FIGS. 1 and 2 each show one thin film transistor. Other embodiments can comprise any desired quantity of thin film transistors. For example, the thin film transistors can be incorporated into an integrated circuit. Other suitable designs for thin film transistors can also be employed. Further, although the above embodiments have been discussed in connection with thin film transistors, it is to be understood that the teachings can be further extended to devices other than thin film transistors that require an organic semiconductor supported on a dielectric layer. For example, diodes can be produced in an analogous manner. Other exemplary semiconductor electronic devices that can be fabricated include light emitting devices, photodetecting devices, photovoltaic cells, photoconductive cells, photoresistive cells, photodiodes, and photoswitches.

In one embodiment, suitable semiconductor compounds are synthesized. All synthetic procedures are performed under a nitrogen atmosphere using conventional Schlenk line techniques. The reagents 5,5'-bis(tri-n-butylstannyl)-2,2'-bithiophene, 2,5-bis(tri-n-butylstannyl)-thiophene, and 5,5'-dibromo-2,2'-bithiophene are prepared according to known procedures. General procedures for preparation of tributylstannyl derivatives are employed with slight modifications for the compounds 2-(tri-n-butylstannyl)-5-(4-n-hexylphenyl)thiophene and 1-(tri-n-butylstannyl)-4-n-hexylbenzene. The reagent 1,4-bis(2-thienyl)benzene is prepared via the Grignard coupling of 2-thienylmagnesium bromide with 1,4-diiodobenzene. Alternatively, 1,4-bis(2-thienyl)benzene can be synthesized by transition-metal-catalyzed coupling of 2-thienylzinc chloride with 1,4-dibromobenzene. The reagent 1,4-bis(5-bromo-2-thienyl)benzene is synthesized by bromination of 1,4-bis(2-thienyl)benzene in dimethylformamide (DMF) with N-bromosuccinimide, and 2,5-bis(4-bromophenyl)-thiophene is synthesized by the Pd(0)-catalyzed coupling of 2,5-dibromothiophene with 4-bromophenylboronic acid according to a known procedure. Other chemicals and solvents are obtained from commercial sources. See the following references, the entirety of which are incorporated herein by reference, for background information: M. Mushrush et al., "Easily Processable Phenylene-Thiophene-Based Organic Field-Effect Transistors and Solution-Fabricated Nonvolatile Transistor Memory Elements," J. Am. Chem. Soc., Vol. 125, pp. 9414-9423 (2003); Katz, H. E. et al., "Synthesis, Solubility, and Field-effect Mobility of Elongated and Oxa-substituted α,ω-Dialkyl Thiophene Oligomers. Extension of "Polar Intermediate" Synthetic Strategy and Solution Deposition on Transistor Substrates", Chem. Mater., Vol. 10, pp. 633-638 (1998); Li, W. et al, "Field-effect Transistors Based on Thiophene Hexamer Analogues with Diminished Electron Donor Strength", Chem. Mater. Vol. 11, pp. 458-465 (1999); and Hong, X. M. et al., "Thiophene-Phenylene and Thiophene-Thiazole Oligomeric Semiconductors with High Field-Effect Transistor On/Off Ratios," Chem. Mater., 13, pp. 4686-4691 (2001).

Preparation of 2-(tri-n-butylstannyl)-5-(4-n-hexylphenyl) thiophene and 1-(tri-n-butylstannyl)-4-n-hexylbenzene is now discussed. To a solution of 5-(4-n-hexylphenyl)thiophene (1.52 grams (g), 6.22 millimoles (mmol)) in dry tetrahydrofuran (THF) (30 milliliters (mL)) in a bath at −78° C. is slowly added a hexane solution of n-butyllithium (n-BuLi), (3.9 mL, 6.2 mmol). After 1 hour (h) of stirring at this temperature, tri-n-butyltin chloride (2.0 g, 6.2 mmol) is added, and the reaction mixture is allowed to warm slowly to room temperature and stirred overnight. Hexane (50 mL) is then added. The reaction mixture is washed with 5% $NaHCO_3$ (20 mL) and water (2×20 mL), dried over $MgSO_4$, filtered, and concentrated in vacuo to give 3.2 g of clear, light yellow liquid (97%). The same procedure is followed for 1-(tri-n-butylstannyl)-4-n-hexylbenzene, and the two compounds so synthesized are used as crude materials in subsequent reactions.

Preparation of 2-(4-n-Hexylphenyl)thiophene is now discussed. A mixture of 4-bromo-n-hexylbenzene (5.68 g, 23.5 mmol), 2-tri-n-butylstannylthiophene (8.84 g, 23.7 mmol), and tetrakis(triphenylphosphine)-palladium(0) (0.4 g, 0.4 mmol) in dry DMF (90 mL) is heated under nitrogen at 90° C. overnight. After the reaction is cooled to room temperature, water (250 mL) and hexane (100 mL) are added. The organic layer is separated, and the aqueous layer is extracted with hexane (2×100 mL). The organic layers are combined, washed with water (2×100 mL), dried over $MgSO_4$, filtered, and concentrated in vacuo to give a clear orange liquid. After purification by column chromatography on silica gel (hexane), 2-(4-n-hexylphenyl)thiophene is obtained as a clear, colorless liquid.

Preparation of 5,5'-Bis(4-n-hexylphenyl)-2,2'-bithiophene (6PTTP6) is now discussed. A mixture of 4-bromo-n-hexylbenzene (1.21 g, 5.02 mmol), 5,5'-bis(tri-n-butylstannyl)-2, 2'-dithiophene (1.69 g, 2.27 mmol), and $Pd(PPh_3)_4$ (0.07 g, 0.06 mmol) in DMF (35 mL) is heated under nitrogen at 80° C. overnight. The dark yellow precipitate is then collected, washed several times with methanol, diethyl ether, and hexane, and dried under reduced pressure (0.75 g, 68%). The crude solid is recrystallized from toluene/hexane to afford an analytically pure yellow-orange solid.

Preparation of 5,5''-Bis(4-n-hexylphenyl)-2,2':5',2''-terthiophene (6PTTTP6) is now discussed. A mixture of 2,5-dibromothiophene (0.39 g, 1.6 mmol), 2-(tri-n-butylstannyl)- 5-(4-n-hexylphenyl)thiophene (3.97 mmol), and $Pd(PPh_3)_4$ (0.07 g, 0.06 mmol) in DMF (15 mL) is heated under nitrogen at 90° C. overnight. The precipitate is then collected, washed several times with methanol, acetone, diethyl ether, and hexane, and dried under reduced pressure (0.70 g, 76%). The crude product is then recrystallized from toluene/1,1,2-trichloroethane to give an analytically pure light orange solid.

Preparation of 5,5'''-Bis(4-n-hexylphenyl)-2,2':5',2'':5'', 2'''-quaterthiophene (6PTTTTP6) is now discussed. A mixture of 2-(tri-n-butylstannyl)-5-(4-n-hexylphenyl)thiophene (4.49 mmol), 5,5'-dibromo-2,2'-bithiophene (0.58 g, 1.79 mmol), and $Pd(PPh_3)_4$ (0.08 g, 0.07 mmol) in DMF (30 mL) is heated under nitrogen at 90° C. overnight. The precipitate is then collected, washed several times with methanol, diethyl ether, and hexane, and dried under reduced pressure (0.87 g, 75%). The crude product is then recrystallized from toluene/ 1,1,2-trichloroethane to give an analytically pure dark orange solid.

Preparation of 1,4-Bis[5-(4-n-hexylphenyl)-2-thienyl] benzene (6PTPTP6) is now discussed. A mixture of 1-(tri-n-butylstannyl)-4-n-hexylbenzene (2.6 mmol), 1,4-bis(5-bromo-2-thienyl)benzene (0.40 g, 1.0 mmol), and $Pd(PPh_3)_4$ (0.06 g, 0.05 mmol) in dry DMF (20 mL) is heated under nitrogen at 90° C. overnight. The precipitate is then collected and washed several times with methanol, ether, and hexane to give a yellow-brown solid (0.46 g, 82%), which is then recrystallized from toluene/1,1,2-trichloroethane.

Preparation of 2,5-Bis[4(4'-n-hexylphenyl)phenyl] thiophene (6PPTPP6) is now discussed. A mixture of 1-(tri-n-butylstannyl)-4-n-hexylbenzene (5.1 mmol), 2,5-bis(4-bromophenyl)thiophene (0.80 g, 2.03 mmol), and $Pd(PPh_3)_4$ (0.1 g, 0.08 mmol) in dry DMF (35 mL) is heated under nitrogen at 90° C. overnight. After the reaction mixture has cooled, it is filtered, and the precipitate is washed several times with methanol, ether, and hexane to give a tan-yellow solid (0.69 g, 69%), which is recrystallized from toluene/1,1, 2-trichloroethane.

Preparation of 2,6-bis(5-hexylthien-2-yl)naphthalene (6TNT6) is now discussed. This compound can be synthesized by using 2,6-dihydroxynaphthalene and 2-tributylstannyl-5-hexylthiophene. The compound 2-tributylstannyl-5-hexylthiophene can be prepared by starting with commercially available 2-hexylthiophene, treating it successively, as a 10% solution in tetrahydrofuran, with butyllithium at −70° C. for one hour and then with tributylstannyl chloride at −70° C. to room temperature overnight. The resulting product 2-tributylstannyl-5-hexylthiophene solution is then diluted with hexane and washed with aqueous sodium bicarbonate. The hexane is then removed by rotary evaporation. The compound 2,6-dihydroxynaphthalene, commercially available from Sigma-Aldrich, is converted to the corresponding ditriflate. The conversion to the ditriflate, and the coupling of the ditriflate with 2-tributylstannyl-5-hexylthiophene to form 6TNT6, are performed as described for similarly functionalized compounds in Echavarren, A. M. and Stille, J. K., J. Am. Chem. Soc. 109, 5478-5486 (1987), the entirety of which is herein incorporated by reference.

Preparation of 5,5'''-Bis(4-n-hexyl)-2,2':5',2'':5'',2'''-quaterthiophene (6TTTT6) is now discussed. A mixture of 6.2 g of bithiophene, 8.0 g of hexanoic anhydride, and 0.4 g boron trifluoride etherate is heated to about 100° C. and allowed to cool. The resulting mixture is dissolved in toluene, washed with aqueous sodium bicarbonate (allowing for venting of carbon dioxide gas), dried with magnesium sulfate, filtered, concentrated on a rotary evaporator, and chromatographed on 160 grams of silica gel eluting with hexane/methylene chloride mixtures. The product 5'-hexanoylbithiophene is isolated. The 5'-hexanoylbithiophene (3.9 g sample) is added to a stirred mixture of 3.0 g of aluminum chloride and 3.4 g of lithium aluminum hydride suspended in 300 mL of ethyl ether. After 1 hour, 50 mL ethyl acetate and 15 mL of concentrated hydrochloric acid are cautiously added, and the mixture is filtered, concentrated, and eluted through 30 g of silica gel with hexane. The product 5'-hexylbithiophene is isolated. A measured 2.4 g of this compound is dissolved in 150 mL of tetrahydrofuran. A measured 9.6 mmol of butyl-lithium as a hexane solution is added with stirring and cooling to −78° C. After 20 minutes, 2.6 g of cupric chloride is added. The mixture is allowed to warm to room temperature. After one day, dilute hydrochloric acid is added to dissolve the copper salts, and the mixture is dissolved in toluene, washed with concentrated hydrochloric acid and dilute aqueous ammonia, dried with magnesium sulfate, filtered, concentrated, and triturated with hexane, methanol, and petroleum ether.

Preparation of 5,5'''-Bis(4-n-hexyl)-2,2':5',2'':5''',2''':5''', 2''''-pentathiophene (6TTTTT6) is now discussed. The compound 5'-hexyl-5-tributylstannylbithiophene is prepared from 2'-hexylbithiophene using the procedure described for 2-(tri-n-butylstannyl)-5-(4-n-hexylphenyl)thiophene. A measured 6.25 mmol of this compound, 2.5 mmol of 2,5-dibromothiophene, 145 mg of tetrakis(triphenylphosphine) palladium, and 35 mL of toluene are heated just below reflux for three days under nitrogen. The precipitate is successively washed with dilute hydrochloric acid, water, and acetone, and recrystallized from mesitylene with hot filtration.

Preparation of 1,4-Bis[(5-n-hexyl)-2,2'-bithienyl]benzene (6TTPTT6) is carried out by using the same procedure as for the preceding example, except that 1,4-dibromobenzene is substituted for 2,5-dibromothiophene.

Figure 3:
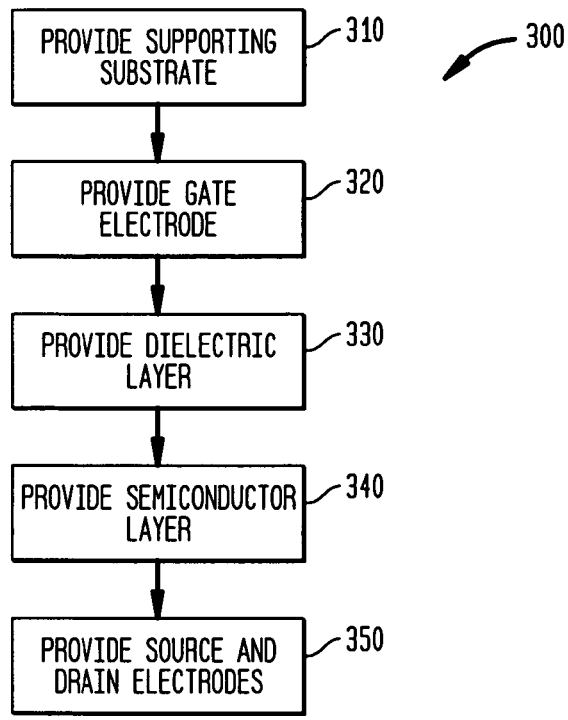
FIG. 3 shows a method of making the thin film transistor shown in FIG. 1.

In another embodiment, four thin film transistors 100 as shown in FIG. 1 were fabricated by an exemplary method 300 shown in FIG. 3.

At step 310, suitable glass wafers were provided to serve as the supporting substrates 110. The glass wafers provided structural support for the transistors 100, and had a dielectric surface comprising silicon dioxide.

At step 320, the gate electrodes 120 were provided on the supporting substrates 110. A thin layer of indium tin oxide (ITO) was deposited onto the surface of each of the supporting substrates 110. ITO peaks were then removed by scrubbing the ITO surfaces for about 20 seconds with celatom, a fine abrasive powder. The supporting substrates 110 were then rinsed with de-ionized water and acetone. Next, the rinsed supporting substrates 110 were dried in an oven at about 130° C. for a few minutes. The supporting substrates were next placed in vertical positions for a period between about 5 minutes and about 10 minutes in a solution of aminopropyltriethoxysilane (1% by volume) in toluene at a temperature within a range between about 50° C. and about 70° C. This treatment provided trimethylsilyl functionalization of the ITO surface, serving as a lipophilic monolayer coating. In an alternative embodiment, hexamethyldisilazane (HMDS) can be substituted for the aminopropyltriethoxysilane. The supporting substrates 110 were rinsed with toluene immediately after exposure to aminopropyltriethoxysilane and allowed to dry at an angle to create a spotless dry surface.

At step 330, the dielectric layers 130 were provided on the ITO gate electrodes 120 and on the supporting substrates 110. Poly (4-vinylphenol-co-2-hydroxyethyl methacrylate), also referred to as PVPH-HEMA, was chosen as the composition for the dielectric layers 130. A solution of 20 g of PVPH-HEMA dissolved in 80 g of 2-butoxyethanol was prepared. The PVPH-HEMA dissolved completely after stirring for a few hours at room temperature. The solution was then filtered using a 0.2 micrometer (μ) filter. A portion of each of the ITO gate electrodes was temporarily protected with scotch tape to facilitate later connection to a test circuit. The four partially-formed transistors were then spin coated with PVPH-HEMA at 1,000 revolutions per minute (rpm) for about 30 to about 45 seconds. The spin coated partially-formed transistors were then baked for about 15 hours at 175° C. until insoluble.

At step 340, the semiconductor layers 140 were provided on the dielectric layers 130. In preparation for deposition of the semiconductor, a fluorinated compound was painted onto the dielectric layer 130 in order to form a rectangle shaped boundary having dimensions of about 1 centimeter (cm) by 2 cm to confine the semiconductor. One exemplary suitable fluorinated compound for this purpose is Novec EGC-1700® fluorocarbon electronic coating, commercially available from the General Electric Company, Stamford, Conn. U.S.A. The compound, 5,5'-bis(4-hexylphenyl)-2,2'-bithiophene (6PTTP6) was selected as the semiconductor for all of the four transistors. The 6PTTP6 was purified prior to use by vacuum sublimation; recrystallization can alternatively be used. In fabricating transistors I, II and IV, a measured 2 milligrams (2 mg) of 6PTTP6 and 5 ml of o-xylene, 98% high pressure liquid chromatography (HPLC) grade, were combined and stirred for half an hour at room temperature to dissolve the 6PTTP6. In fabricating transistor III, the concentration of the 6PTTP6 semiconductor in o-xylene was relatively increased by 50%, by dissolving 3 mg of 6PTTP6 in 5 ml o-xylene.

A xylene vapor environment was created for deposition of the semiconductor solutions. A small beaker was placed upside down inside a larger beaker having a greater height and diameter, spaced from the bottom of the larger beaker by several glass plates leaving room for equilibration of pressure inside the smaller beaker. Although not used here, an alternative technique involves providing a hole in the smaller beaker to facilitate the same equilibration. The larger beaker was then partially filled with o-xylene, to a level below the raised surface constituted by the upside down bottom of the smaller beaker. The larger beaker was then placed on a hotplate at a temperature of about 115° C. and equilibrated for several minutes to generate a temperature of about 70° C. at the raised surface constituted by the upside down bottom of the smaller beaker. The partially-formed transistors were placed on the raised surface prior to deposition of the semiconductor compositions. A loose fitting cover was provided over the top of the larger beaker to slow the evaporation of the o-xylene from the larger beaker. The xylene vapor environment that was so employed slowed the rate of evaporation of the xylene solvent from the subsequently deposited semiconductor solutions, and created an equilibrium with xylene in the deposited semiconductor solutions. This equilibrium bathed the deposited semiconductor compositions in saturated xylene vapor, causing re-dissolution of semiconductor compound molecules in the nascent semiconductor layer and creating opportunities for misaligned crystal domains to re-dissolve and re-form with an orientation that increased the size of adjacent crystal domains. This re-dissolution and re-formation produced polycrystalline layers having larger crystal domains.

The semiconductor composition solution was then deposited within the box formed by the fluorinated compound, so that the box was just filled with the solution. The solvent in the semiconductor composition was then allowed to slowly evaporate in this xylene vapor environment for a few minutes. In fabricating transistor I, two layers of 6PTTP6 were successively so deposited, and the o-xylene was allowed to evaporate from the first layer before application of the second layer. In fabricating transistors II and IV, four layers of 6PTTP6 were successively so deposited, and the o-xylene was allowed to evaporate from each of the first three layers before application of the next layer. In fabricating transistor III, one layer of 6PTTP6 was so deposited, and the o-xylene was then allowed to evaporate.

At step 350, the source electrode 150 and the drain electrode 160 were provided on the semiconductor layer 140. A tungsten wire having a diameter of 6 µm was placed over the semiconductor layer 140 of each partially formed transistor, resting on a piece of scotch tape placed adjacent to the semiconductor layer 140, to block a portion of the semiconductor layer surface. An elongated rectangular mask was then placed on top of the semiconductor layer of each partially formed transistor so that the longitudinal axis of the gap of the mask was perpendicular to the wire axis. The source and drain contacts were then formed at the position of the opening of the mask by evaporating a 50 nanometer (nm) thick layer of gold at 1 angstrom (Å) per second (s) and a pressure of $5 \times 10^{-6}$ Torr. The actual transistor gap between the source and drain electrodes 150 and 160 was formed by the blockage of the semiconductor surface caused by the tungsten wire. The gap had a width to length (W/L) ratio of about 35, where L was about 5 µm.

As discussed earlier, modifications in the fabrication process were intentionally introduced among the four transistors. In fabricating transistor I, two layers of 6PTTP6 were successively deposited, and the o-xylene was allowed to evaporate from the first layer before application of the second layer. In fabricating transistor II, four layers of 6PTTP6 were successively deposited, and the o-xylene was allowed to evaporate from each of the first three layers before application of the next layer. In fabricating transistor III, the concentration of the 6PTTP6 semiconductor in o-xylene was relatively increased by 50%, using 3 mg of 6PTTP6 in 5 ml o-xylene, and only one layer of 6PTTP6 was applied. Transistor IV was fabricated in the same manner as used to fabricate transistor II.

Figure 5:
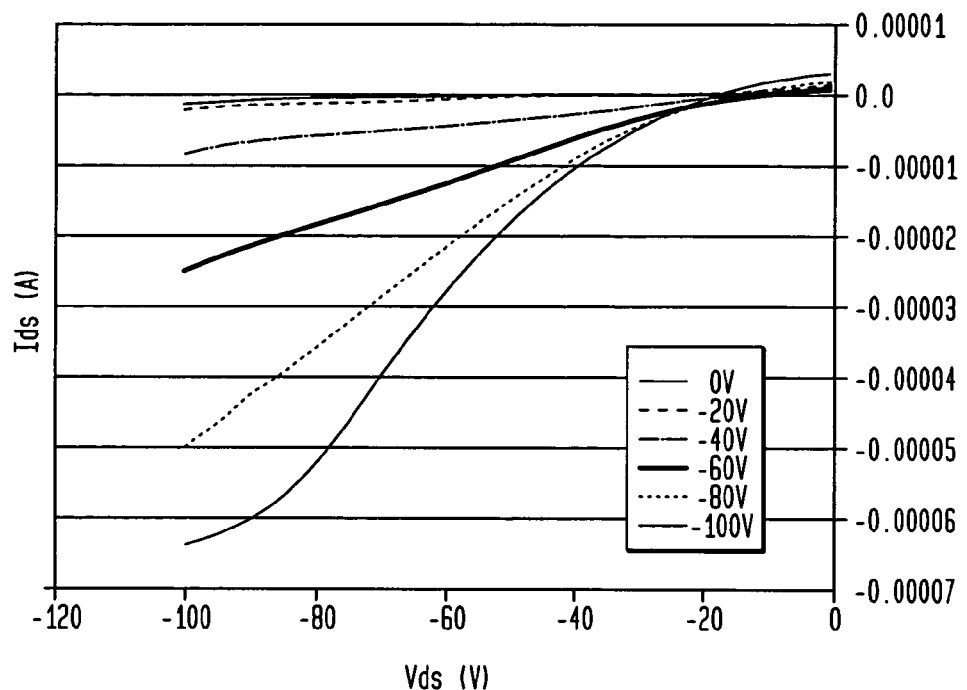
FIG. 5 shows a graph plotting drain-source current versus drain-source voltage for transistor I fabricated according to the invention.
Figure 6:
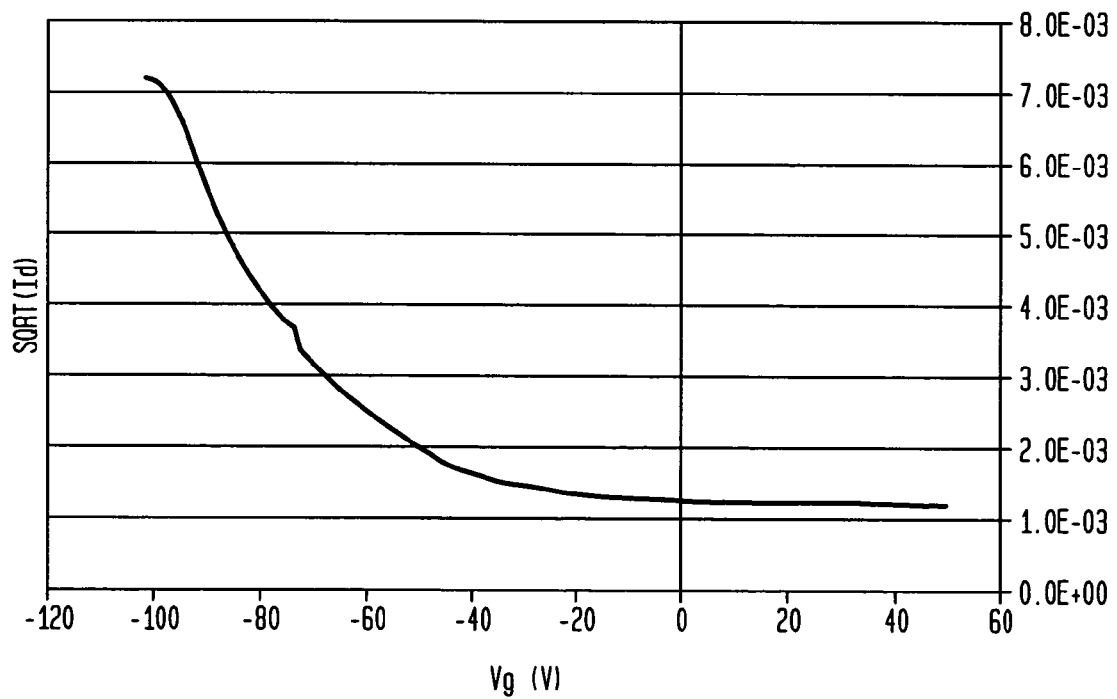
FIG. 6 shows a graph plotting the square root of the drain-source current versus the gate voltage for transistor I fabricated according to the invention.
Figure 7:
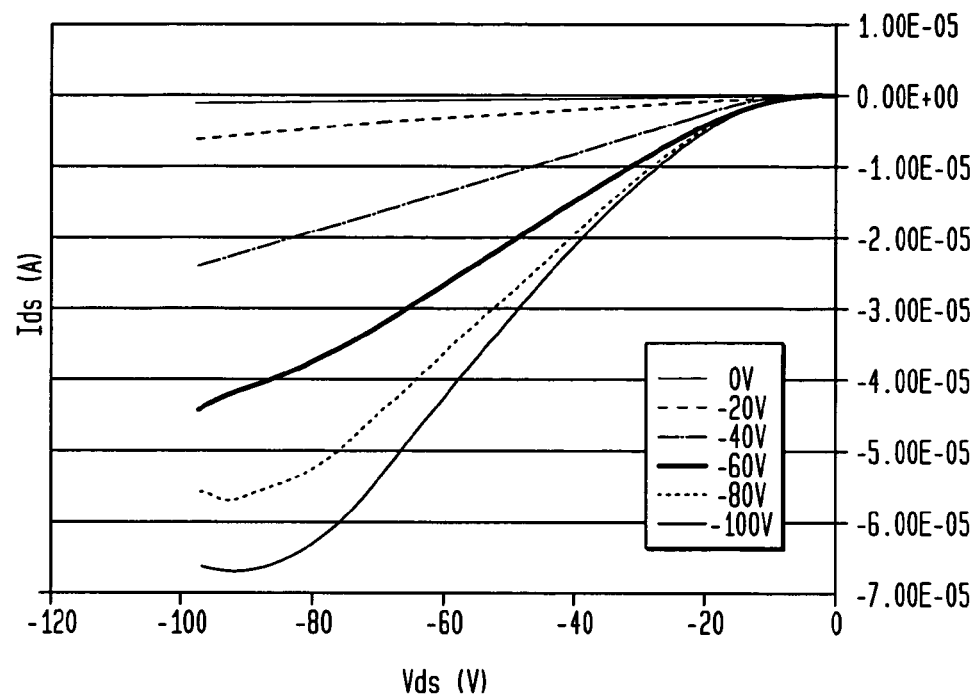
FIG. 7 shows a graph plotting drain-source current versus drain-source voltage for transistor II fabricated according to the invention.
Figure 8:
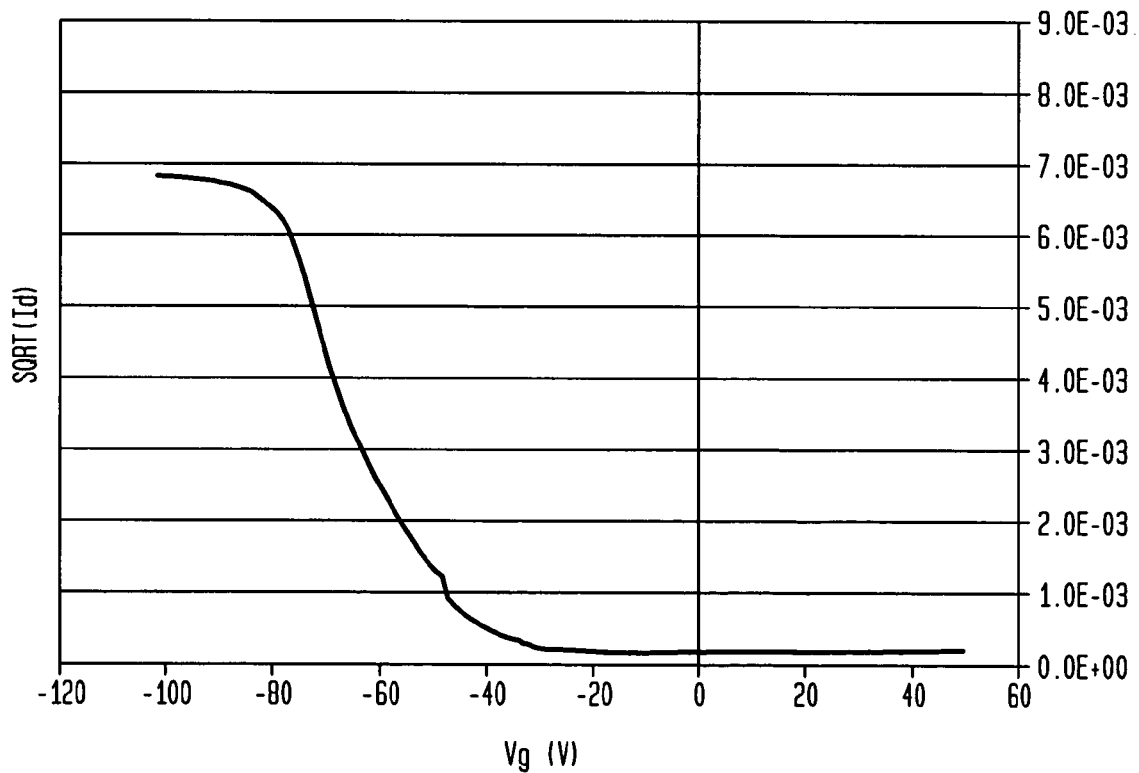
FIG. 8 shows a graph plotting the square root of the drain-source current versus the gate voltage for transistor II fabricated according to the invention.
Figure 9:
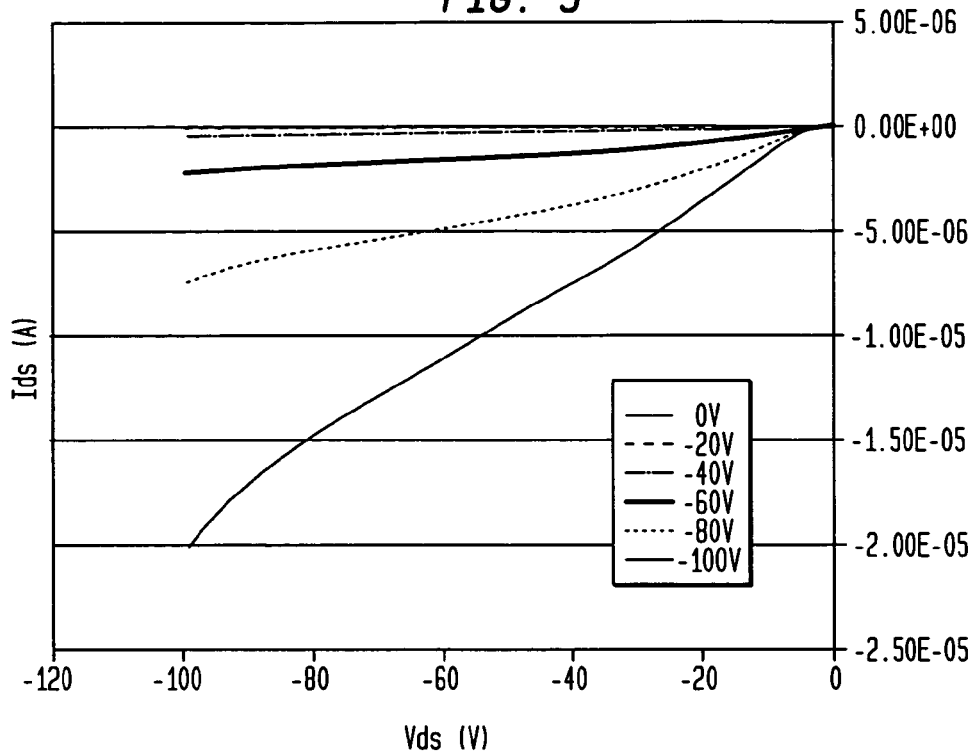
FIG. 9 shows a graph plotting drain-source current versus drain-source voltage for transistor III fabricated according to the invention.
Figure 10:
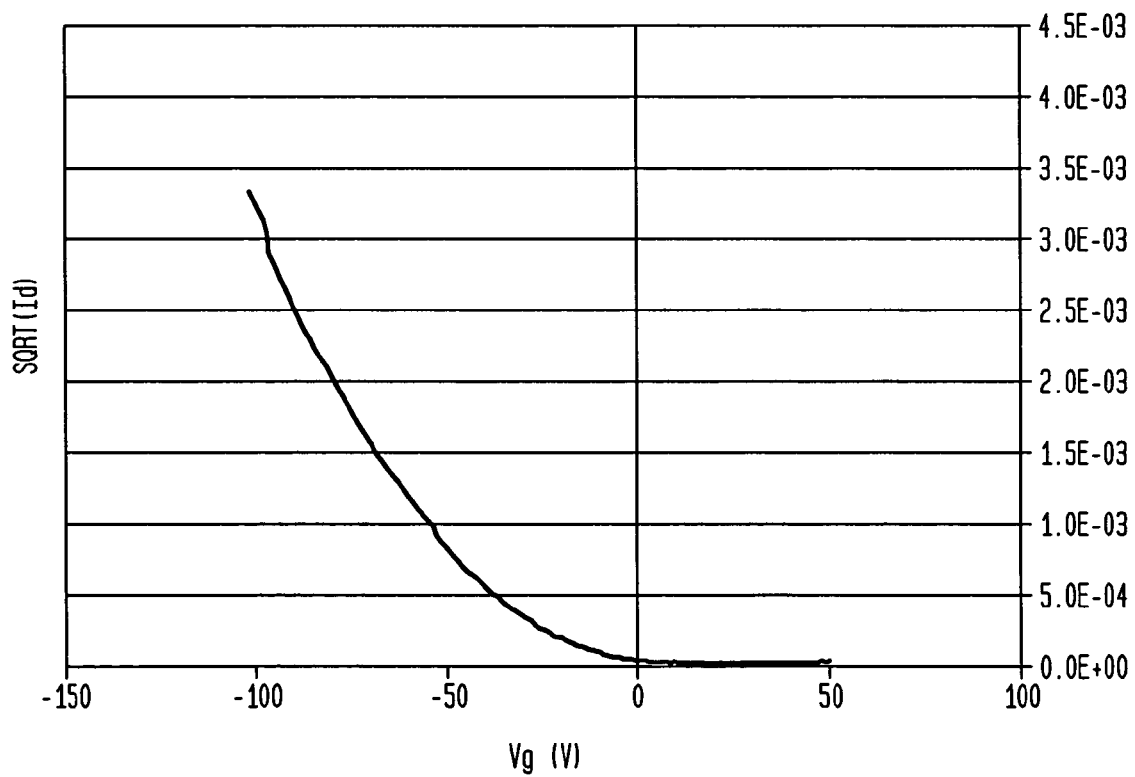
FIG. 10 shows a graph plotting the square root of the drain-source current versus the gate voltage for transistor III fabricated according to the invention.
Figure 11:
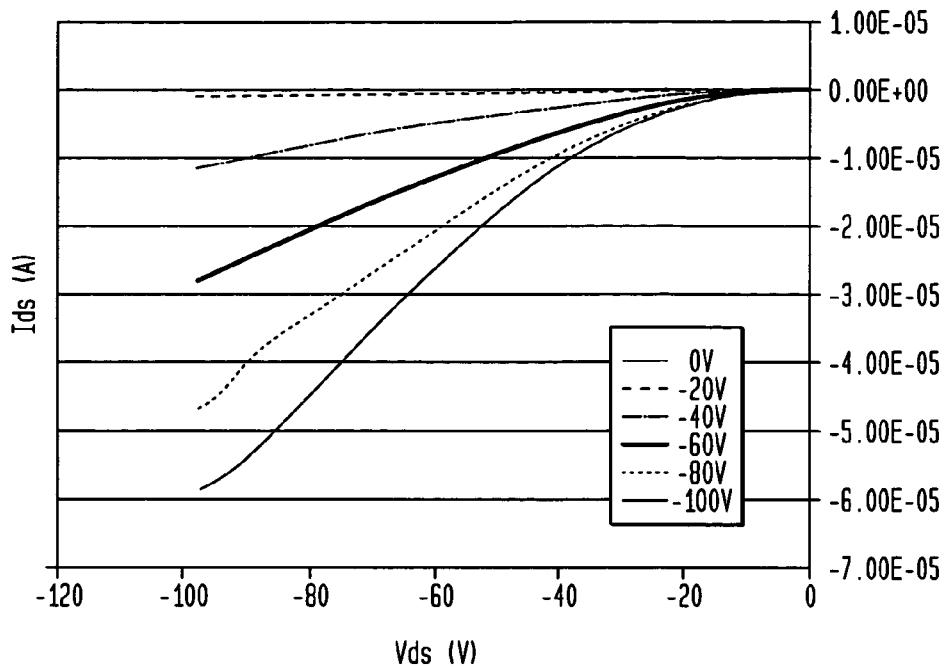
FIG. 11 shows a graph plotting drain-source current versus drain-source voltage for transistor IV fabricated according to the invention.
Figure 12:
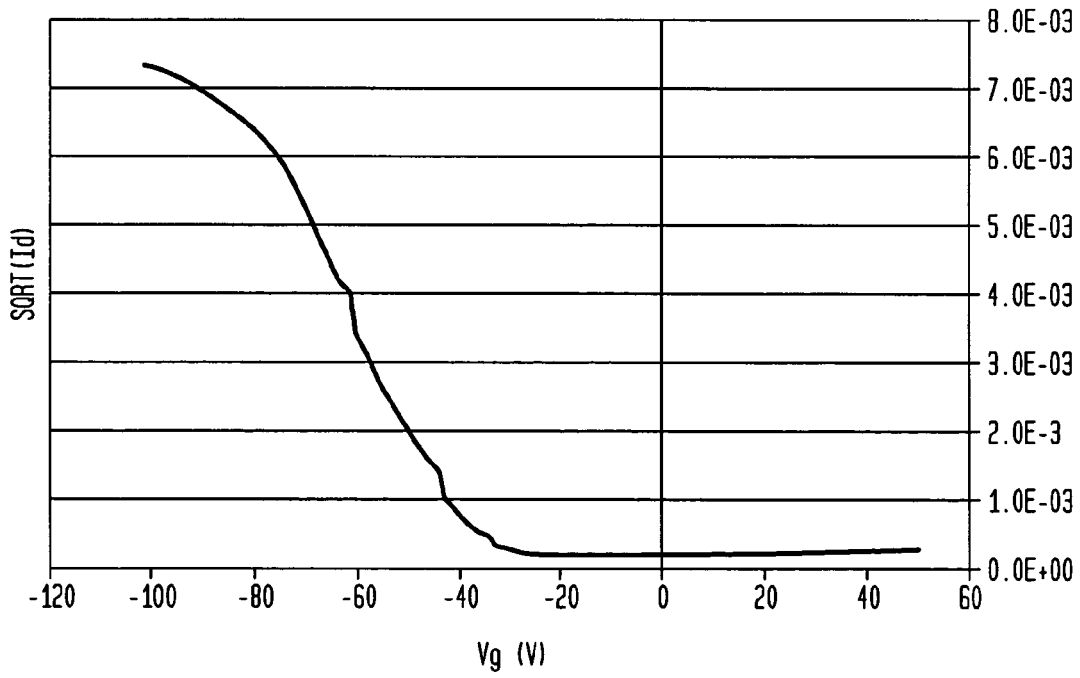
FIG. 12 shows a graph plotting the square root of the drain-source current versus the gate voltage for transistor IV fabricated according to the invention.

The performance features of the four transistors I-IV so fabricated were then characterized. Regarding transistor I, FIG. 5 shows a graph plotting the drain-source current ($I_{ds}$ (A)) versus the drain-source voltage ($V_{ds}$(V)). FIG. 6 shows a graph also relating to transistor I, plotting the square root of the drain-source current (SQRT($I_d$)) versus the gate voltage ($V_g$(V)). Regarding transistor II, FIG. 7 shows a graph plotting $I_{ds}$(A) versus $V_{ds}$(V). FIG. 8 shows a graph, also relating to transistor II, plotting SQRT($I_d$) versus $V_g$(V). Regarding transistor III, FIG. 9 shows a graph plotting $I_{ds}$(A) versus $V_{ds}$(V). FIG. 10 shows a graph, also relating to transistor III, plotting SQRT($I_d$) versus $V_g$(V). Regarding transistor IV, FIG. 11 shows a graph plotting $I_{ds}$(A) versus $V_{ds}$(V). FIG. 12 shows a graph, also relating to transistor IV, plotting SQRT($I_d$) versus $V_g$(V).

Table 1 below is a summary of the results of performance measurements regarding transistors I-IV including the results reported in FIGS. 5-12.

TABLE 1

Performance of transistors I-IV with a mobility larger than 0.1

| RESULTS | TRANSISTOR | | | |
| --- | --- | --- | --- | --- |
| | I | II | III | IV |
| Capacitance (F/cm2) | 5.0E−09 | 4.7E−09 | 3.0E−09 | 4.7E−09 |
| W/L ratio | 35 | 35 | 32 | 35 |
| Slope range (V) | 70-95 | 55-80 | 85-100 | 50-70 |

TABLE 1-continued

Performance of transistors I-IV with a mobility larger than 0.1

| RESULTS | TRANSISTOR | | | |
| --- | --- | --- | --- | --- |
| | I | II | III | IV |
| Off-current (A) | 1.4E−06 | 3.5E−08 | 1.1E−09 | 4.5E−08 |
| On/Off ratio | 3.5E+01 | 1.7E+03 | 1.4E+04 | 1.2E+03 |
| Vt (V) | ~40 | ~40 | ~25 | ~40 |
| Mobility (cm2/Vs) | 0.24 | 0.65 | 0.15 | 0.37 |

For an exemplary p-type semiconductor capable of transporting holes, electrical conductivity is approximated by the formula a $\sigma = en\mu_d$ where $\mu_d$ is the carrier mobility, e is the charge on the carriers, and n is the density of free carriers. Conductivity accordingly is proportional to mobility. Mobility can readily be measured, and the corresponding conductivity can be approximated. Conductivity in a device comprising an organic semiconductor depends on the size and separation of crystal grains. The size distribution of crystal grains determines how many of them must be effectively traversed by a charge carrier in order to be transported from an origin to a destination such as between a source and drain, for example. The separation between crystal grains determines the impact of non crystalline regions on conductivity. For example, crystal grains separated by a distance greater than the maximum inter-grain tunneling distance for a particular semiconductor material may constitute a nonconductive pathway for charge carriers. Conductivity within a crystal grain of an organic semiconductor also depends on charge carrier energy levels and molecular overlaps in the crystal.

Since conductivity is proportional to mobility for materials with one charge carrier type, and mobility can be directly measured, the mobility is generally considered to be the most important parameter for transistor characterization. The On/Off ratio is generally considered to be the second most important parameter. The measurements of transistors I-IV were all performed with a Hewlett Packard 4155 A—Semiconductor Parameter Analyzer. The capacitance of the dielectric layers in transistors I-IV was directly measured by probes attached to a Hewlett-Packard inductance-capacitance-resistance meter with an applied current. The W/L ratio was measured by using an optical microscope. The slope range is the range of the slope, over a selected voltage range, of the curves in the graphs shown in FIGS. 6, 8, 10 and 12 plotting SQRT ($I_d$) versus $V_G$(V). With these slope ranges and with the following formula (1), the mobility of the transistors can be determined.

$$I_{ds} = W/2L \times C_i \mu (V_G - V_T)^2 \quad (1)$$

In formula (1), $I_{ds}$ is the drain-source current, W is the width of the gap, L is the length of the gap, $C_i$ is the capacitance of the gate-dielectric layer, µ is the mobility, $V_G$ is the gate voltage and $V_T$ is the threshold voltage. An applied drain-source current of −100 volts was used in testing the transistors.

Since the graphs shown in FIGS. 6, 8, 10 and 12 are not perfectly straight lines, one has to choose a specific voltage range for use in slope calculations, over which the plotted data in each of these graphs nearly form a straight line. The chosen voltage range was as large as possible.

The performance results obtained for each transistor, as shown in FIGS. 5-12, differ due to the different indicated applied gate voltages. Further, although transistor IV was prepared on the same substrate as used for transistor II, it showed a slightly different morphology. All of the transistors I-IV exhibited extremely high mobilities in excess of 0.1.

In carrying out the fabrication of the exemplary transistor 100, the solvent for use desirably is selected for compatibility with the compositions employed to fabricate the semiconductor layer and the dielectric layer. In one embodiment, the solvent is an aromatic compound. In another embodiment, the solvent is selected for its capability to dissolve the selected semiconductor. In another embodiment, the solvent is selected for its inability to dissolve or otherwise degrade the selected dielectric layer composition, or cause delamination of the dielectric layer 130 from the gate layer 120. In a further embodiment, the solvent is selected for its relatively low boiling point in order to facilitate its evaporation from the applied semiconductor layer. In one embodiment, the solvent is o-xylene, m-xylene, p-xylene, or a mixture. In embodiments where the selected semiconductor composition comprises 5,5'-Bis(4-n-hexylphenyl)-2,2'-bithiophene, use instead of benzene, toluene, chlorobenzene, chloroform, 1,2,5-trichlorobenzene, 1,1,2,2-tetrachloroethane, or 1,2-dichloroethane may result in uneven semiconductor films with areas of heavy deposition.

Figure 4:
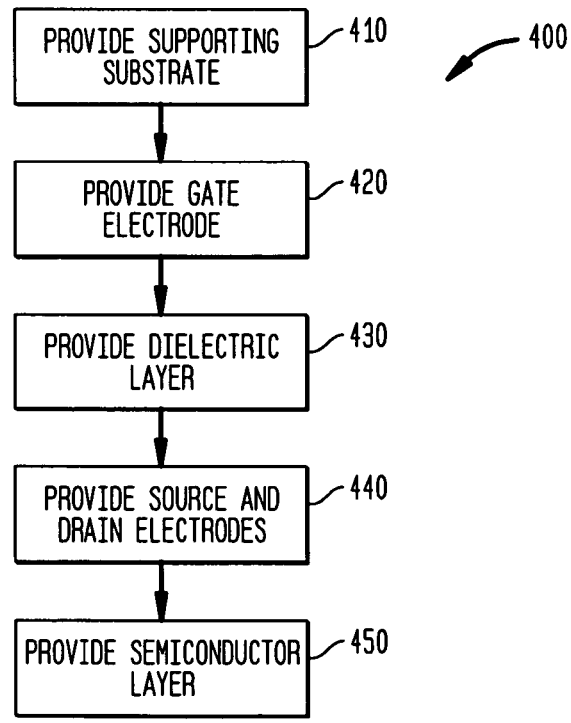
FIG. 4 shows a method of making the thin film transistor shown in FIG. 2.

In another embodiment, a thin film transistor 200 as shown in FIG. 2 is fabricated by an exemplary method 400 shown in FIG. 4.

At step 410, a suitable glass wafer is provided to serve as the supporting substrate 210. The glass wafer provides structural support for the transistor 200, and has a dielectric surface comprising silicon dioxide.

At step 420, the gate electrode 220 is provided on the supporting substrate 210 in the same manner as described above in connection with step 320 of FIG. 3.

At step 430, the dielectric layer 230 is provided on the gate electrode 220 in the same manner as described above in connection with step 330 of FIG. 3.

At step 440, the source electrode 240 and the drain electrode 250 are provided on the dielectric layer 230. A tungsten wire having a diameter of 6 μm is placed over the dielectric layer 230, resting on a piece of scotch tape, to block a portion of the dielectric layer surface. An elongated rectangular mask is then placed on top of the dielectric layer 230 so that the longitudinal axis of the gap of the mask is perpendicular to the wire axis. The source and drain contacts are then formed at the position of the opening of the mask by evaporating a 50 nanometer (nm) thick layer of gold at 2 Å/s and a pressure of $5 \times 10^{-6}$ Torr. The actual transistor gap between the source and drain electrodes 240 and 250 is formed by the blockage of the dielectric surface caused by the tungsten wire. The gap has a W/L ratio of about 45, where L is about 5 μm.

At step 450, the semiconductor layer 260 is provided on the source electrode 240, the drain electrode 250, and the dielectric layer 230. In preparation for deposition of the semiconductor, a fluorinated compound is painted onto the source electrode 240, the drain electrode 250, and the dielectric layer 230 in the same manner as described above in connection with step 340 of FIG. 3. The semiconductor layer 260 is then applied over the source electrode 240, the drain electrode 250, and the dielectric layer 230 otherwise in the same manner as described above in connection with step 340 of FIG. 3.

The processes employed in fabricating the exemplary transistors I-IV discussed above and as discussed in connection with FIGS. 3 and 4 are exemplary and non limiting embodiments of methods to be used. Other suitable methods for making the exemplary devices shown in FIGS. 1-2 can also be used. For example, the exemplary gate electrode 120, source electrode 150, and drain electrode 160 can be fabricated by other suitable processes for applying layers of the selected electrode materials to a substrate, such as by electron beam evaporation, electrodeposition, printing of a conducting polymer, or sputtering. The dielectric layer 130 can be fabricated by other suitable processes for applying a layer of the selected composition for forming the dielectric layer to a substrate, such as by surface initiated growth, spin coating, immersion coating, or casting. In order to make the semiconductor layer, the dielectric layer 130 can for example be saturated with the selected solvent, droplets of the semiconductor solution can be applied using an ink jet, and the dielectric layer 130 can then be moved into a controlled environment saturated with solvent vapor to facilitate semiconductor crystallization. Alternatively, the dielectric layer 130 can be chilled in a controlled environment to prevent water condensation, the semiconductor droplets can be applied, and the dielectric layer can then be moved into the controlled environment saturated with solvent vapor. Alternatively, a mist of the selected solvent can be provided in the vicinity of the ink jet as the semiconductor droplets are applied, and the dielectric layer can then be moved into the controlled environment saturated with solvent vapor. Further, a relatively high boiling solvent can be selected, the semiconductor droplets can be applied, and the dielectric layer can then be moved into the controlled environment saturated with solvent vapor. In one embodiment, the spacing between the source electrode 150 and the drain electrode 160 is minimized in order to maximize the potential of forming a single crystal of the selected semiconductor spanning the channel between such electrodes. In a further embodiment, the temperature at which the semiconductor solution is deposited onto the dielectric substrate 130 is controlled so that the vapor pressure of the selected solvent is at least about 0.25 atmosphere. In another embodiment, the temperature is controlled so that the vapor pressure is within a range between about 0.25 atmosphere and about 1.0 atmosphere. In an additional embodiment, the temperature is controlled so that the vapor pressure is within a range between about 0.25 atmosphere and about 0.5 atmosphere. For example, o-xylene has a boiling point of about 143° C., and an optimum semiconductor deposition temperature of about 110° C.

In one embodiment, given a voltage of −100V from source to drain across a test transistor, the channel mobility of the semiconductor is desirably at least about 0.05 centimeters squared per volt-second ($cm^2/Vs$), preferably at least about 0.1 $cm^2/Vs$, and more preferably at least about 0.2 $cm^2/Vs$, at room temperature. The semiconductor within the channel desirably has an average crystal grain size of at least about 0.1 micrometer, more preferably at least about 1 micrometer. In another embodiment, the on/off drain current ratio of a transistor produced as described herein is at least about 100, more preferably at least about 1,000, even more preferably at least about 10,000. In a further embodiment, the on resistance is less than $1 \times 10^8$ ohms per square. In an additional embodiment, the on-current is greater than about 50 microamps.

While the present invention has been disclosed in the context of various aspects of presently preferred embodiments, it will be recognized that the invention may be suitably applied to other environments consistent with the claims which follow.

We claim:

1. A semiconductor apparatus, comprising: a dielectric layer comprising a surface, a portion of said surface having exposed aromatic groups, said dielectric layer being formed from a precursor composition including a member selected from the group consisting of: naphthalenes, styrenes, phenols, benzenes, and cresols; and a polycrystalline semiconductor layer comprising an organic semiconductor composition overlying and in contact with said portion of said surface, said organic semiconductor composition comprising a compound comprising a chain-like moiety, the chain-like moiety comprising a conjugated thiophene or phenyl group and comprising alkyl chains at ends of the chain-like moiety.

2. The semiconductor apparatus of claim 1, in which each of said moieties comprises on average at least about three conjugated aromatic rings.

3. The semiconductor apparatus of claim 2, in which each of said moieties comprises on average between about three and about six conjugated aromatic rings.

4. The semiconductor apparatus of claim 3, in which the semiconductor composition comprises a member selected from the group consisting of: 5,5'-Bis(4-n-hexylphenyl)-2,2'-bithiophene; 5,5''-Bis(4-n-hexylphenyl)-2,2':5',2''-terthiophene; 5,5'''-Bis(4-n-hexylphenyl)-2,2':5',":5",2'''-quaterthiophene; 1,4-Bis[5-(4-n-hexylphenyl)-2-thienyl]benzene; 2,5-Bis[4(4'-n-hexylphenyl)phenyl]thiophene; 5,5'''Bis(4-n-hexyl)-2,2':5',2":5''',2''''-quaterthiophene; 5,5''''-Bis(4-n-hexyl)-2,2':5',2''':5''',2''''pentathiophene; 1,4-Bis[(5-n-hexyl)-2,2'-bithienyl]benzene; 2,6-bis(5-hexylthien-2-yl)naphthalene; and mixtures.

5. The semiconductor apparatus of claim 4, in which the semiconductor composition comprises 5,5'-Bis(4-n-hexylphenyl)-2,2'-bithiophene.

6. The semiconductor apparatus of claim 1, in which the alkyl chains comprise on average between about 3 and about 12 carbon atoms.

7. The semiconductor apparatus of claim 1, in which said polycrystalline semiconductor layer has a mobility of at least about 0.1 centimeters squared per volt-second.

8. The semiconductor apparatus of claim 1, in which said polycrystalline semiconductor layer has an average semiconductor crystal size of at least about 0.1 micrometer.

9. The semiconductor apparatus of claim 1, further comprising: a gate electrode; a source electrode; and a drain electrode; said source and drain electrodes being in spaced apart conductive contact with a channel portion of said semiconductor layer, said gate electrode being positioned to control a conductivity of said channel portion.

10. The semiconductor apparatus of claim 9, in which the channel portion has an on/off ratio of at least about 100.

11. The semiconductor apparatus of claim 1, in which said dielectric layer comprises poly(4-vinylphenol-co-2-hydroxyethyl methacrylate).

12. The semiconductor apparatus of claim 1, in which said dielectric layer comprises a polyphenol, a polystyrene, a poly(4-vinylphenol-co-2-hydroxyethyl methacrylate), or a poly(phenoxyethyl methacrylate).

13. The semiconductor apparatus of claim 1, in which an alkyl chain comprises, as a linkage in the chain, a member selected from the group consisting of oxygen, nitrogen or sulfur.

14. The semiconductor apparatus of claim 1, in which an alkyl chain comprises a hetero substituent.

15. The semiconductor apparatus of claim 1, in which a thiophene or phenyl group includes an alkyl- or hetero-substituent.

16. The semiconductor apparatus of claim 1, in which the dielectric layer has at least the polarizability of chlorobenzene.

17. An integrated circuit, comprising: a dielectric layer comprising a surface, a portion of said surface having exposed aromatic groups, said dielectric layer being formed from a precursor composition including a member selected from the group consisting of: naphthalenes, styrenes, phenols, benzenes, and cresols; a polycrystalline semiconductor layer comprising an organic semiconductor composition overlying and in contact with said portion of said surface, said organic semiconductor composition comprising a compound comprising a chain-like moiety, the chain-like moiety comprising a conjugated thiophene or phenyl group and comprising alkyl chains at ends of the chain-like moiety; a gate electrode; a source electrode; and a drain electrode; said source and drain electrodes being in spaced apart conductive contact with a channel portion of said semiconductor layer, said gate electrode being positioned to control a conductivity of said channel portion.

18. The integrated circuit of claim 17, in which said dielectric layer includes a polyphenol, a polystyrene, a poly(4-vinylphenol-co-2-hydroxyethyl methacrylate), or a poly(phenoxyethyl methacrylate).

19. A semiconductor apparatus, comprising: a dielectric layer comprising a surface, a portion of said surface having exposed aromatic groups, said dielectric layer including a polyphenol, a polystyrene, a poly(4-vinylphenol-co-2-hydroxyethyl methacrylate), or a poly(phenoxyethyl methacrylate); and a polycrystalline semiconductor layer comprising an organic semiconductor composition overlying and in contact with said portion of said surface, said organic semiconductor composition comprising a compound comprising a chain-like moiety, the chain-like moiety comprising a conjugated thiophene or phenyl group and comprising alkyl chains at ends of the chain-like moiety.

20. The semiconductor apparatus of claim 19, further comprising: a gate electrode; a source electrode; and a drain electrode; said source and drain electrodes being in spaced apart conductive contact with a channel portion of said semiconductor layer, said gate electrode being positioned to control a conductivity of said channel portion.

* * * * *